US006574119B2

(12) United States Patent
Kaltenbach

(10) Patent No.: US 6,574,119 B2
(45) Date of Patent: Jun. 3, 2003

(54) ELECTRONIC DEVICE

(75) Inventor: Dirk Kaltenbach, Wiesbaden (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/026,074

(22) Filed: Dec. 24, 2001

(65) Prior Publication Data

US 2002/0080595 A1 Jun. 27, 2002

(30) Foreign Application Priority Data

| | | |
|---|---|---|
| Dec. 22, 2000 | (DE) | 100 64 464 |
| Jan. 3, 2001 | (DE) | 101 53 103 |
| Nov. 16, 2001 | (DE) | 101 56 128 |

(51) Int. Cl.[7] .......... H05K 7/02
(52) U.S. Cl. .......... 361/807; 361/752; 174/50.52
(58) Field of Search .......... 361/728, 752, 361/756, 758, 770, 804, 807, 811, 812; 174/84 C, 88 R, 50.52, 50.56, 50.6, 59

(56) References Cited

U.S. PATENT DOCUMENTS 2,456,554 A 12/1948 Churchill

FOREIGN PATENT DOCUMENTS

DE 296 18 601 U1 2/1997

*Primary Examiner*—David Martin
*Assistant Examiner*—Phuong T. Vu
(74) *Attorney, Agent, or Firm*—Laurence A. Greenberg; Werner H. Stemer; Gregory L. Mayback

(57) ABSTRACT

An electronic device, in particular for a motor vehicle, has an electronic component that is disposed in a housing and has one or more connection lugs, is described. A cable leads into the housing and is formed by a corresponding number of lines. It is proposed that each connection lug is connected in an electrically conducting manner to the line assigned to it in the housing by a crimp connection. This achieves a simple construction of the device, with the result that it can be easily produced without great monitoring expenditure.

6 Claims, 1 Drawing Sheet

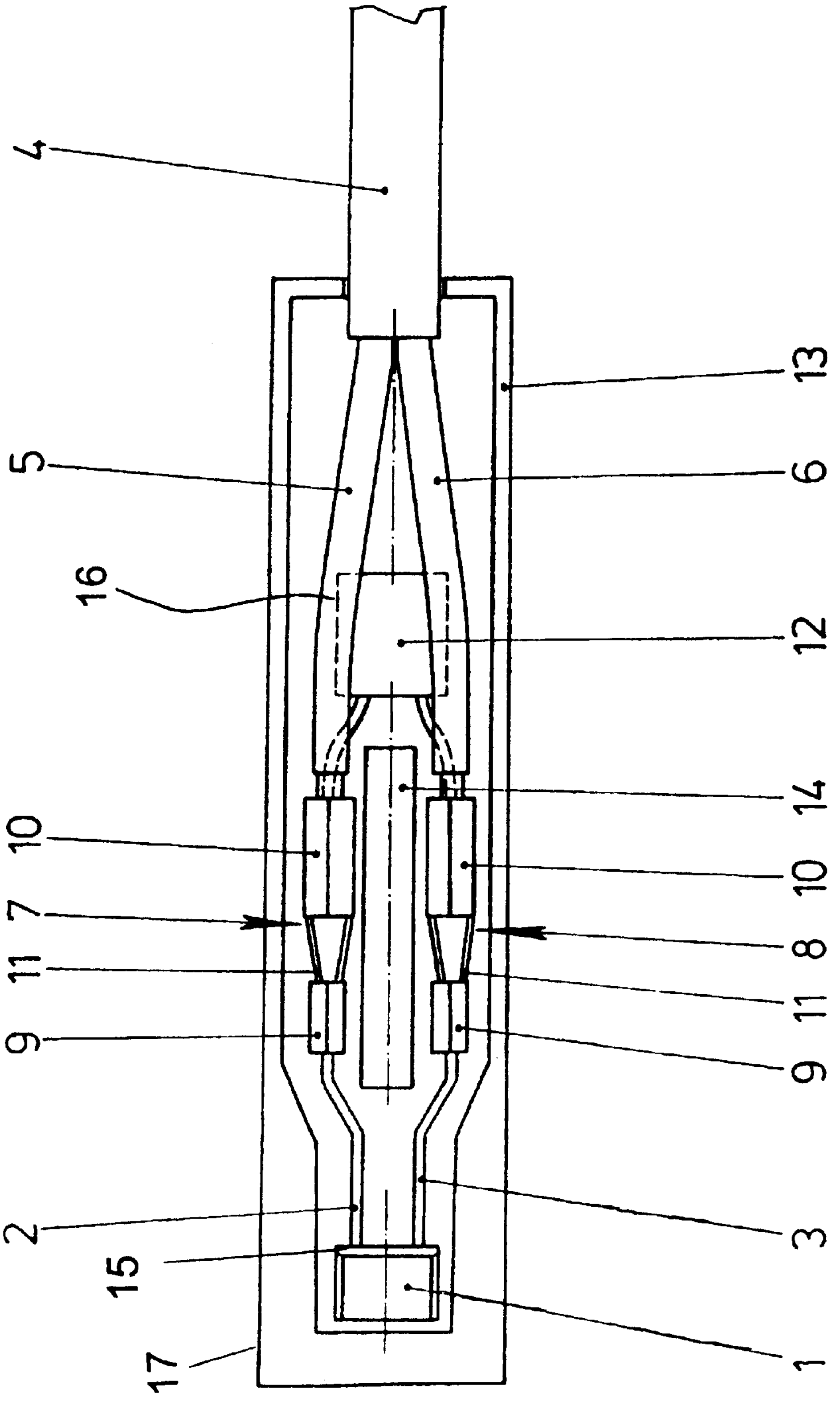
4
5
6
13
16
12
14
10
10
7
8
11
11
9
9
2
3
15
1
17

ELECTRONIC DEVICE

BACKGROUND OF THE INVENTION

FIELD OF THE INVENTION

The invention relates to an electronic device, in particular in a motor vehicle, with an electronic component which is disposed in a housing and has one or more connection lugs, and with a cable which leads into the housing and is formed by a corresponding number of lines.

The device may be, for example, a sensor, in particular a Hall-effect sensor, which is used inter alia for wheel speed determination within an antilock brake control system or as a belt buckle switch. The cable may in this case also be configured in such a way that it has a plug connection, one of the plug elements being fixed to the housing and the other plug element, connectable with the first, being fixed to the cable.

Sensors of this type must be of a robust construction, must work within a wide temperature range and must be mechanically stable. Furthermore, it is intended that they can be produced easily and inexpensively.

Until now such sensors have been constructed in such a way that the electronic components necessary for them were welded on a metallic frame forming conductor tracks. Since a welded connection is determined by many parameters, errors frequently occurred during assembly with robots, with the result that the number of rejects could only be kept down by very careful monitoring of the welding installation.

SUMMARY OF THE INVENTION

It is accordingly an object of the invention to provide an electronic device which overcomes the above-mentioned disadvantages of the prior art devices of this general type. To satisfy the requirements stated above, it is proposed that each connection lug is connected in an electrically conducting manner to the line assigned to it in the housing by a crimp connection.

With the foregoing and other objects in view there is provided, in accordance with the invention, an electronic device. The electronic device contains a housing, an electronic component disposed in the housing and having connection lugs, crimp connections disposed in the housing, and a cable leading into the housing and having a number of lines corresponding to a number of the connection lugs. Each of the connection lugs is connected in an electrically conducting manner to one of the lines in the housing by one of the crimp connections.

This achieves the effect that it is possible to dispense with a metallic frame, which significantly simplifies the construction of the device. It is particularly advantageous, however, that the crimp connection can be produced by a robot without great monitoring expenditure, since the quality of the crimp connection is determined only by a small number of easily satisfied parameters.

A crimp connection typically contains a ferrule that, in its original state, forms a half-shell open to one side, in which the end of the line or connection lug with which contact is to be established is placed. To produce a connection, the side walls of the half-shell are deformed in a defined manner, for example pressed inward, the ends being firmly clamped in the deformed ferrule and entering into an electrically conducting connection with the ferrule.

As a development of the invention, it is proposed that each crimp connection contains two ferrules connected to each other in an electrically conducting manner, the one ferrule receiving the end of the connection lug and the other receiving the end of the line. The two ferrules are preferably disposed one behind the other in an axial direction.

The miniaturization of electronic components has reached a very advanced stage, with the result that for example a magnetic-field-sensitive element and the necessary driving elements are disposed in one module. Some components, such as for example a high-capacitance capacitor, still have to be constructed separately however, because of their size. For such a case, it is proposed that the connection lugs of a further electronic component are also accommodated in the ferrules for the lines.

With the construction proposed until now, the connection of the components by the crimp connection can initially take place outside the housing. Subsequently, the prepared and assembled elements are placed into a shell with one or more channels, which is divided by a cross-piece produced from an electrically non-conducting material, preferably plastic, with the result that the individual crimp connections are electrically isolated from one another. Furthermore, depressions for the first component and possibly for the further components may be provided in the shell.

Finally, the shell is surrounded with a plastic enclosure, produced by the injection-molding process, to form the housing.

Other features which are considered as characteristic for the invention are set forth in the appended claims.

Although the invention is illustrated and described herein as embodied in an electronic device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a diagrammatic, illustration of an electronic device according to the invention.

DESCRIPTION OF THE PREFERRED EMBODIMENTS

Referring now to the single figure of the drawing in detail, there is shown an exemplary embodiment of the invention. An electronic component is denoted by 1. In this exemplary embodiment, this is a sensor module 1 with two connection lugs 2, 3, which are connected to lines 5, 6 of a two-wire cable 4.

For this purpose, a crimp connection 7 or 8 is provided for each connection and respectively contains two ferrules 9, 10 disposed one behind other, which are connected to each other by a connecting cross-piece 11.

Each ferrule 9 facing the sensor module 1 has an end of the connection lug 2 or 3 placed in it and connected in a conducting manner to the respective connection lug 2 or 3 by pressing the ferrule 9 together. The same happens with the stripped ends of the lines 5, 6 in ferrules 10 facing the cable 4, with the result that the lines 5, 6 are connected in an electrically conducting manner to the connection lugs 2, 3.

In the ferrules 10 facing the cable 4, a further component 12, for example a capacitor 12, may be additionally connected, the connection wires of the further component 12 being included in the crimp connection 7, 8.

The components 1, 12 connected in this way are placed into depressions 15, 16 formed in a shell 13 of plastic, which is distinguished in particular by the fact that a cross-piece 14 runs between the crimp connections 7, 8, the cross-piece 14 being electrically isolated from the connections.

Subsequently, the shell 13 is encapsulated 17, the encapsulation 17 being given an outer contour that is adapted to the respective area of use.

I claim:

1. An electronic device, comprising:

a housing having a shell formed from plastic with an interior space formed therein, said housing having a cross-piece disposed in said interior space defining channels;

an electronic component disposed in said housing and having connection lugs;

crimp connections disposed in said housing, each of said crimp connections having two ferrules connected to each other in an electrically conducting manner, said two ferrules of each of said crimp connections being disposed in said channels and being electrically isolated from one another; and a cable leading into said housing and having a number of lines corresponding to a number of said connection lugs, each of said connection lugs connected in an electrically conducting manner to one of said lines in said housing by one of said crimp connections.

2. The device according to claim 1, wherein a first ferrule of said two ferrules of each of said crimp connections receives an end of one of said connection lugs and a second ferrule of said two ferrules receives an end of one of said lines.

3. The device according to claim 2, including a further electronic component disposed in said housing and having further connection lugs fixed in said second ferrule.

4. The device according to claim 1, wherein said shell has depressions formed therein for receiving said electronic component and said further electronic component.

5. The device according to claim 4, wherein said housing includes a plastic enclosure surrounding said shell, said plastic enclosure produced by an injection-molding process, to form said housing.

6. The device according to claim 1, wherein said electronic component is a sensor.

* * * * *